United States Patent
Vemula et al.

(10) Patent No.: US 9,698,786 B2
(45) Date of Patent: Jul. 4, 2017

(54) INTERFACE APPARATUS WITH LEAKAGE MITIGATION

(71) Applicant: Nexperia B.V., Eindhoven (NL)

(72) Inventors: Madan Mohan Reddy Vemula, Tempe, AZ (US); Harold Hanson, Queen Creek, AZ (US)

(73) Assignee: Nexperia B.V., Eindhoven (NL)

( * ) Notice: Subject to any disclaimer, the term of this patent is extended or adjusted under 35 U.S.C. 154(b) by 11 days.

(21) Appl. No.: 14/725,366

(22) Filed: May 29, 2015

(65) Prior Publication Data

US 2016/0352323 A1    Dec. 1, 2016

(51) Int. Cl.
*H03K 17/30* (2006.01)
*G06F 13/20* (2006.01)
*H03K 19/0185* (2006.01)
*G06F 13/24* (2006.01)
*G06F 13/40* (2006.01)

(52) U.S. Cl.
CPC ......... *H03K 19/0185* (2013.01); *G06F 13/24* (2013.01); *G06F 13/4068* (2013.01); *H03K 2217/0054* (2013.01)

(58) Field of Classification Search
CPC ......... H02H 1/00; H02B 1/24; G06F 1/3206; G06F 1/26; G06F 3/04; G06F 13/409
USPC ............... 307/125; 327/530, 534, 535, 382; 710/20, 15, 16, 62, 313
See application file for complete search history.

(56) References Cited

U.S. PATENT DOCUMENTS

| | | | | |
|---|---|---|---|---|
| 5,942,784 | A * | 8/1999 | Harima | H01L 27/0921 257/371 |
| 6,885,234 | B2 * | 4/2005 | Ando | H03K 17/08142 327/534 |
| 7,268,561 | B2 | 9/2007 | Zhu | |
| 7,274,247 | B2 * | 9/2007 | Ward | H03K 19/0027 327/534 |
| 8,625,029 | B2 | 1/2014 | Doyle et al. | |
| 8,940,594 | B2 * | 1/2015 | Chen | H01L 21/823807 257/369 |
| 9,268,381 | B2 * | 2/2016 | He | G06F 1/26 |

(Continued)

FOREIGN PATENT DOCUMENTS

EP    2028854 B1    7/2011

*Primary Examiner* — Dinh T Le
(74) *Attorney, Agent, or Firm* — Ohlandt, Greeley, Ruggiero & Perle, L.L.P.

(57) ABSTRACT

Aspects of the present disclosure are directed to detecting and powering external circuits via a common port. As may be implemented in accordance with one or more embodiments, an accessory detection circuit detects a type of an external circuit based upon a pull-down resistance at an interface port (e.g., where each accessory type provides a discernable pull-down resistance). Power switching circuitry couples power between the interface port and an internal power-based circuit, and operates in an open condition when the accessory detection circuit is active. An adaptive biasing circuit sets a voltage across the power switching circuitry to about zero, based on a voltage level provided on the interface port, thereby mitigating changes in the pull-down resistance due to current leakage. Once the type of external circuit is identified, the power switching circuitry couples power between the external circuit and the internal circuit.

20 Claims, 5 Drawing Sheets

(56) References Cited

U.S. PATENT DOCUMENTS

2004/0027006 A1\* 2/2004 Kuroiwa .................. G06F 1/26
307/125

\* cited by examiner

INTERFACE APPARATUS WITH LEAKAGE MITIGATION

Aspects of various embodiments are directed to communications, and to circuitry that mitigates current leakage in connection with communications with different types of circuits.

Various types of circuitry operate to interface with different types of circuits, which may be connected to a common port. For instance, portable computers or mobile devices such as telephones or tablets often employ a common type of interface port that can be coupled to a variety of different types of external devices. Such external devices may include, for example, storage devices, cameras, power chargers, video monitors, keyboards, and wireless communication devices. Some mobile interface devices perform multi-channel signal switching for a variety of accessories, such as with USB2.0 and UART signals. The accessories include BC1.2, USB OTG, factory testing mode accessories, UART cable, customer accessories and reserved accessories. For such applications, it can be important to identify the type of device connected to the interface port.

Some approaches to device identification in these contexts can be challenging to implement. For example, resistances presented at an interface port can be indicative of a type of device that is connected to the port. However, different types of devices may present very similar resistances, which can be difficult to distinguish. In particular, leakage current (e.g., on such an interface port) may make it challenging to detect pull down or pull up resistors that can be used to identify an attached cable or component. Accordingly, variations in conditions of circuitry, including that connected to such an interface port, can make detecting resistance challenging.

These and other matters have presented challenges to communications and device connectivity, for a variety of applications.

Various example embodiments are directed to interface circuits and their implementation.

According to an example embodiment, an apparatus includes an interface port that communicates power and data with external devices connected to the interface port, and a first circuit that detects and identifies a type of external circuit connected to the interface port based on electrical characteristics presented at the interface port via the external circuit. Such characteristics may include, for example, resistance, current or voltage characteristics and may be implemented via pull-up resistance, pull-down resistance, a current source or a current sink. A first circuit path includes first and second transistors that couple power between the interface port and an internal circuit, the first transistor having source/drain terminals respectively connected to the interface port and to the second transistor, and the second transistor having source/drain terminals respectively connected to the first transistor and the internal circuit. A second circuit operates with the first circuit and the first transistor to mitigate current leakage by setting a voltage across the source/drain terminals of the first transistor based on a voltage level provided on the interface port. In various implementations, an accessory type detection circuit is implemented with the first and second circuits, together therewith or as a separate circuit, and which operates to detect a type of an accessory connected to the interface port (e.g., while leakage is mitigated via the second circuit).

Other embodiments are directed to a method as follows. In a first circuit, a type of external circuit connected to an interface port is detected and identified based on resistance presented at the interface port via the external circuit, the interface port being operable for communicating power and data with external circuits connected thereto. In a first circuit path including first and second transistors, power is coupled between the interface port and an internal circuit via source/drain terminals of the first transistor connected to the interface port and to the second transistor, and via source/drain terminals of the second transistor respectively connected to the first transistor and the internal circuit. Current leakage in the first circuit path is mitigated by setting a voltage across the source/drain terminals of the first transistor based on a voltage level provided on the interface port. Accordingly, such current leakage that may otherwise affect detection of external circuits on the interface port can be mitigated.

Another embodiment is directed to an apparatus including an accessory detection circuit, power switching circuitry and an adaptive biasing circuit. The accessory detection circuit detect a type of external circuit coupled to an interface port based upon characteristics at the interface port, in which each type of accessory provides characteristics that are discernable from circuit characteristics of the other types of accessories. Such characteristics may include, for example, pull-down resistance, pull-up resistance, current source or current sink aspects. The power switching circuitry includes first and second transistors that couple power between the interface port and an internal power-based circuit. The first transistor has source/drain terminals respectively connected to the interface port and to the second transistor, and the second transistor has source/drain terminals respectively connected to the first transistor and the internal circuit. The adaptive biasing circuit operates with the power switching circuitry to, while the accessory detection circuit detects the type of the external circuit, mitigate current leakage across the first transistor. Such aspects may be implemented with power switches that may be large, and may exhibit drain-source or source-drain leakages, or related leakage to a corresponding substrate. In this context, the transistors are operated in an open state, and a voltage across both the source/drain terminals of the first transistor and across a p-n junction coupling the interface port to a reference terminal are set to about zero based on a voltage level provided on the interface port. This mitigates changes in the pull-down resistance due to current leakage. In response to detecting and identifying the type of external circuit connected to the interface port, the voltages across the source/drain terminals and the p-n junction are no longer set to zero, and power is coupled between the external circuit and the internal circuit by operating the first and second transistors in a closed state.

The above discussion/summary is not intended to describe each embodiment or every implementation of the present disclosure. The figures and detailed description that follow also exemplify various embodiments.

DESCRIPTION OF THE FIGURES

Various example embodiments may be more completely understood in consideration of the following detailed description in connection with the accompanying drawings, in which.

Figure 1:
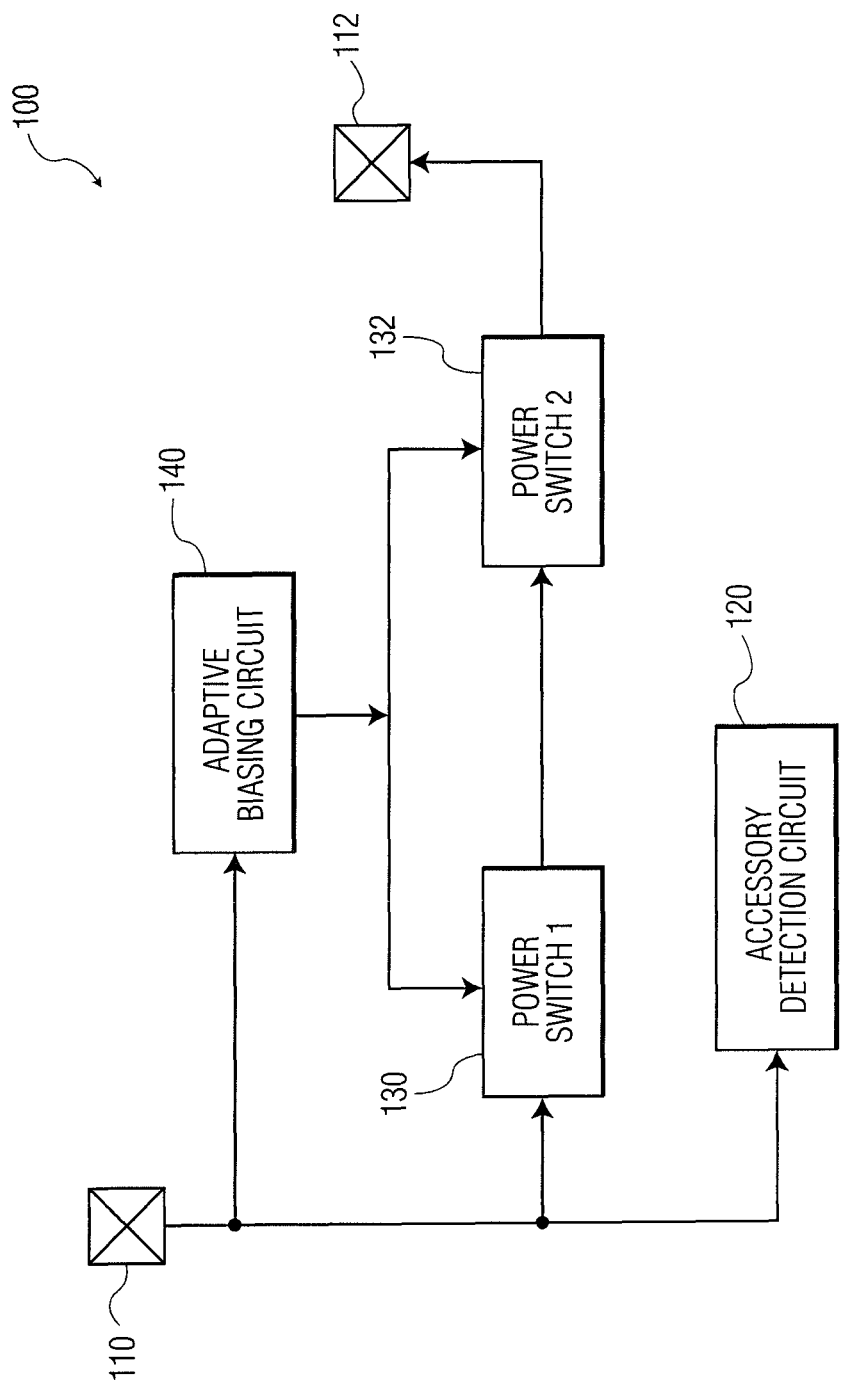
FIG. 1 shows an interface apparatus, in accordance with an example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving detection, identification and interaction with external circuits coupled to an interface port. In certain implementations, aspects of the present disclosure have been shown to be beneficial when used in the context of identifying external circuits based on resistance. In particular, aspects of the disclosure are useful in providing accurate identification of external circuits in applications in which resistance sensitivity is important for properly identifying the external circuits. These approaches can be useful in addressing current leakage and challenges such as those noted in the background above. As such, various embodiments may be implemented in the context of USB, USB OTG, Type C connector, or UART type connections, or other connections to external circuits as may involve mobile telephones, tablets, laptops, media circuits and other peripheral and accessory circuits that connect via an interface port. While not necessarily so limited, various aspects may be appreciated through a discussion of examples using such exemplary contexts.

In particular embodiments, on-chip current leakage is mitigated for a power switch by adaptive biasing, which facilitates support circuit type detection on an interface port/pin that is shared between the power switch and circuitry that identifies the circuit type. Such a biasing approach may involve biasing p-n junction regions to provide a voltage differential (e.g., near zero) that mitigates current flow. Different leakages can be addressed in this manner. For instance, off-channel leakage current from a source to a drain of one or more power-switching transistors can be mitigated (e.g., in an environment in which a 6 V drain voltage with 0 V source and gate voltage may cause about 25 uA of leakage current). Junction leakage from a source/drain region to substrate, as may be passed across a p-n junction of a diode-type structure, can be similarly mitigated via coupling of a bias across the p-n junction. Mitigating such leakage as above can facilitate the identification of connected components. For instance, effects upon components such as pull down or pull up resistors that are used to identify connected components can be mitigated, facilitating detection thereof.

In various embodiments, a power switch connecting an interface port includes two or more respective switching transistors having respective source/drain terminals connected to one another. A first one of the switching transistors is directly connected to the interface port, and is biased such that a source-to-drain voltage is balanced using the voltage at the interface port (e.g., with the terminals being at about the same voltage/zero voltage differential). Accordingly, off-channel current leakage of the first switching transistor is about zero. Similarly, a junction voltage across a diode coupling the first switching transistor to ground/reference voltage is balanced to provide about zero volts across a p-n junction.

According to an example embodiment, an apparatus includes an interface port that communicates power and data with external circuits connected to the interface port, and a first circuit that detects and identifies a type of external circuit connected to the interface port based on resistance presented at the interface port via the external circuit (e.g., a pull-down resistance). A first circuit path includes first and second transistors that couple power between the interface port and an internal circuit, the first transistor having source/drain terminals respectively connected to the interface port and to the second transistor, and the second transistor having source/drain terminals respectively connected to the first transistor and the internal circuit (e.g., a battery circuit or internal power circuit). A second circuit operates with the first circuit and the first transistor to mitigate current leakage by setting a voltage across the source/drain terminals of the first transistor (e.g., off-channel leakage) based on a voltage level provided on the interface port.

Changes in resistance of the interface port are effected in a variety of manners. In some implementations, the second circuit operates with the first circuit and the first circuit path to, in response to an external circuit being connected to the interface port, operate the first and second transistors in an open state and mitigate current leakage through the first transistor by coupling the voltage at the interface port to the respective source/drain terminals of the first and second transistor that are connected to one another. For implementations involving a further second circuit path having a p-n junction coupled to a reference or ground type node or rail, a third circuit mitigates current leakage through the p-n junction by setting a voltage across the p-n junction to about zero, using the voltage level provided on the interface port. In certain implementations, the second circuit path includes a switch coupled between the p-n junction and the reference terminal and operates in an open condition while the first circuit is detecting and identifying the type of external circuit connected to the interface port.

In various embodiments, an accessory detection circuit (e.g., the first circuit above) includes a plurality of variable resistor circuits, and detects and identifies the type of external circuit connected to the interface port based on pull down resistance presented at the interface port via the external circuit. A reference resistance provided by the plurality of variable resistor circuits based is tuned based on a comparison between the reference resistance and a resistance provided by the external circuit at the interface port, and used to precisely identify the pull-down resistance. Current leakage is mitigated during such detection, which facilitates detection of small differences in resistances that may otherwise be obscured.

In certain embodiments, the second and third circuits operate with the first and second circuit paths as follows. In response to the external circuit being connected to the interface port, the voltages across the source/drain terminals of the first transistor and across the p-n junction are set to about zero. In response to the first circuit detecting and identifying the type of external circuit connected to the interface port, the setting of the voltages is ceased, power is coupled between the external circuit and the internal circuit by operating the first and second transistors in a closed state, and the p-n junction is connected to the reference terminal. In various implementations, the second and third circuits operate with the first and second circuit paths to couple power between the external circuit and the internal circuit by powering the external circuit with power from the internal circuit, or by coupling power from the external circuit to the internal circuit (e.g., for charging a battery), based on the identified type of external circuit.

In some embodiments, the first circuit detects and identifies the type of the external circuit based on the resistance, while the first and second transistors are operated in an open state and while the second circuit sets the voltage across the source/drain terminals of the first transistor. The first circuit path operates, in response to the first circuit identifying the type of external circuit connected to the interface port, by ceasing setting of the voltage across the source/drain terminals of the first transistor, and couple power between the external circuit and the internal circuit by connecting the interface port to the internal circuit via the first transistor and the second transistor.

Approaches as noted above may, for example, be implemented in a circuit having a power rail and a reference node/rain that provide power for operating the apparatus, in which the transistors are decoupled or floated. For instance, where the first and second transistors have source and drain regions in a well region, a switch may operate to float the well region, and a second circuit path having a p-n junction as noted above may be biased with about a zero voltage drop across the junction.

Other embodiments are directed to methods as may be implemented in accordance with one or more apparatuses as described herein, and otherwise. In accordance with a particular embodiment, a type of external circuit connected to an interface port is detected and identified in a first circuit, based on resistance presented at the interface port via the external circuit (e.g., a pull-down resistance). In a first circuit path including first and second transistors, power is coupled between the interface port and an internal circuit via source/drain terminals of the first transistor connected to the interface port and to the second transistor, and via source/drain terminals of the second transistor respectively connected to the first transistor and an internal circuit (e.g., a battery circuit or internal power circuit). Current leakage is mitigated by setting a voltage across the source/drain terminals of the first transistor (e.g., off-channel leakage) based on a voltage level provided on the interface port, which can be coupled with operating the transistors in an open state to prevent current flow.

In various contexts, current leakage is also mitigated through a p-n junction that couples the interface port to a reference or ground, by similarly setting a voltage across the p-n junction to about zero. The second circuit path can also be disconnected from the reference terminal while detecting and identifying the type of external circuit connected to the interface port. In response to the external circuit being connected to the interface port, the voltage across the source/drain terminals of the first transistor and the p-n junction can be set to about zero. Once the type of external circuit connected to the interface port is identified, the setting of the voltages can be ceased, and power can be coupled with the external circuit.

Turning now to the figures, FIG. 1 shows an interface apparatus 100 in accordance with an example embodiment. The apparatus 100 operates to couple power and data with an external device (i.e., circuit) via interface port 110. An accessory detection circuit 120 operates to detect types of accessories connected to the interface port 110. Switching circuitry including a first power switch 130 and a second power switch 132 operate to couple power between the interface port 110 and another port 112 (e.g., a battery or other interface port). An adaptive biasing circuit 140 operates to apply a bias to the switching circuitry to mitigate current leakage, while the accessory detection circuit 120 detects the type of external device connected to the port 110.

In various implementations, the first power switch 130 and second power switch 132 are biased such that a voltage drop across the first power switch is about zero. For instance, a node between the respective switches can be biased to a voltage level corresponding to a voltage presented at the interface port 110. In further embodiments, a well region in which the first power switch resides is also biased, such that a voltage drop across a p-n junction therein lying between the interface port and a reference/ground-type node is also about zero.

Figure 2:
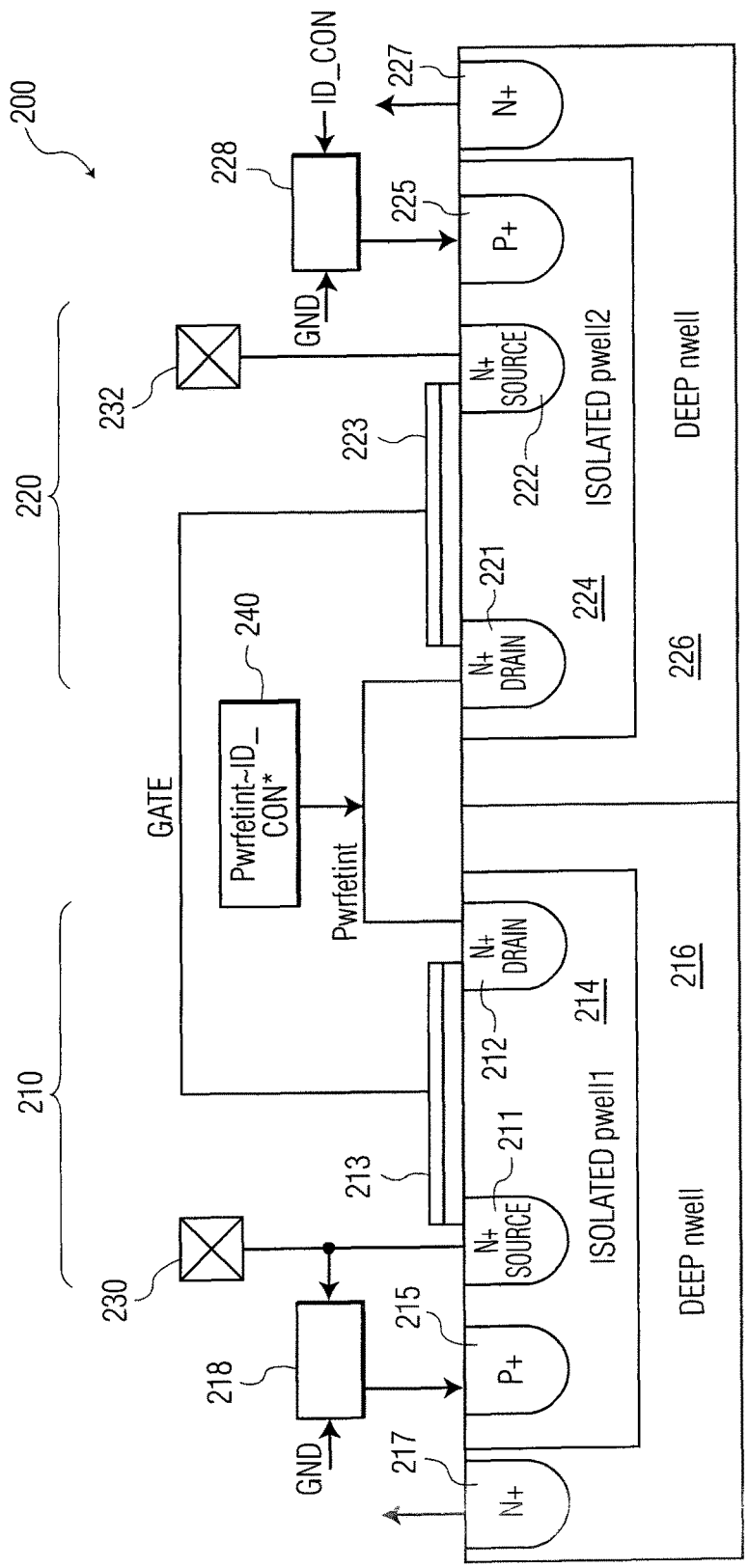
FIG. 2 shows a cross-sectional view of a semiconductor apparatus, in accordance with another example embodiment.

FIG. 2 shows a cross-sectional view of a semiconductor apparatus 200, in accordance with another example embodiment. The apparatus 200 includes respective switches 210 and 220 coupled in series, which couple power between an interface pin 230 and another power pin 232. Power may be coupled in this context, for example, between an external device connected to the interface pin 230 and an internal battery or power source. As such, power may flow in either direction, such as for drawing power from an external device or for powering the external device.

The switch 210 includes a source 211 and drain 212 that are located in a well region 214, and a gate 213 that operates to control conductivity between the source and drain and therein effect switching. Similarly, switch 220 includes a source 222 and a drain 221 that are in a well region 224, and a gate 223 that operates to control conductivity between the source and drain of the switch 220. The respective well regions 214 and 224 include contacts 215 and 225, and are formed in deep well regions 216 and 226. A bias circuit 240 biases the drains 212 and 221 relative to a voltage presented at the interface pin 230, and as such works to mitigate the passage of leakage current through the first switch 210.

In various implementations, the well regions 214 and 224 are also coupled to a voltage presented at the interface pin 230, via respective contacts 215 and 225. The deep well regions 216 and 226 may further be coupled to a voltage (e.g., 3 V) via contacts 217 and 227, which limits a maximum voltage of the well regions 214 and 224 and prevents conduction to the deep wells.

The apparatus 200 may be implemented in a variety of manners, to suit particular embodiments. For instance, the apparatus 200 may be implemented in connection with switches 130 and 132 in FIG. 1. By way of example, the apparatus 200 is shown implemented in an NMOS structure having a deep n-well in which local p-wells are created for the respective switches (e.g., in a single process). The interface port 230 may be implemented with an ID_CON type input that is used to identify a type of circuit connected thereto, utilizing the bias circuit 240 to mitigate leakage and facilitating a relatively accurate resistance detection. Further, the well regions 214 and 224 may be biased to a voltage level of the interface port 230 when the switches are in an on state, and coupled to ground/reference voltage when the switches are in an off state, via circuits 218 and 228.

Figure 3:
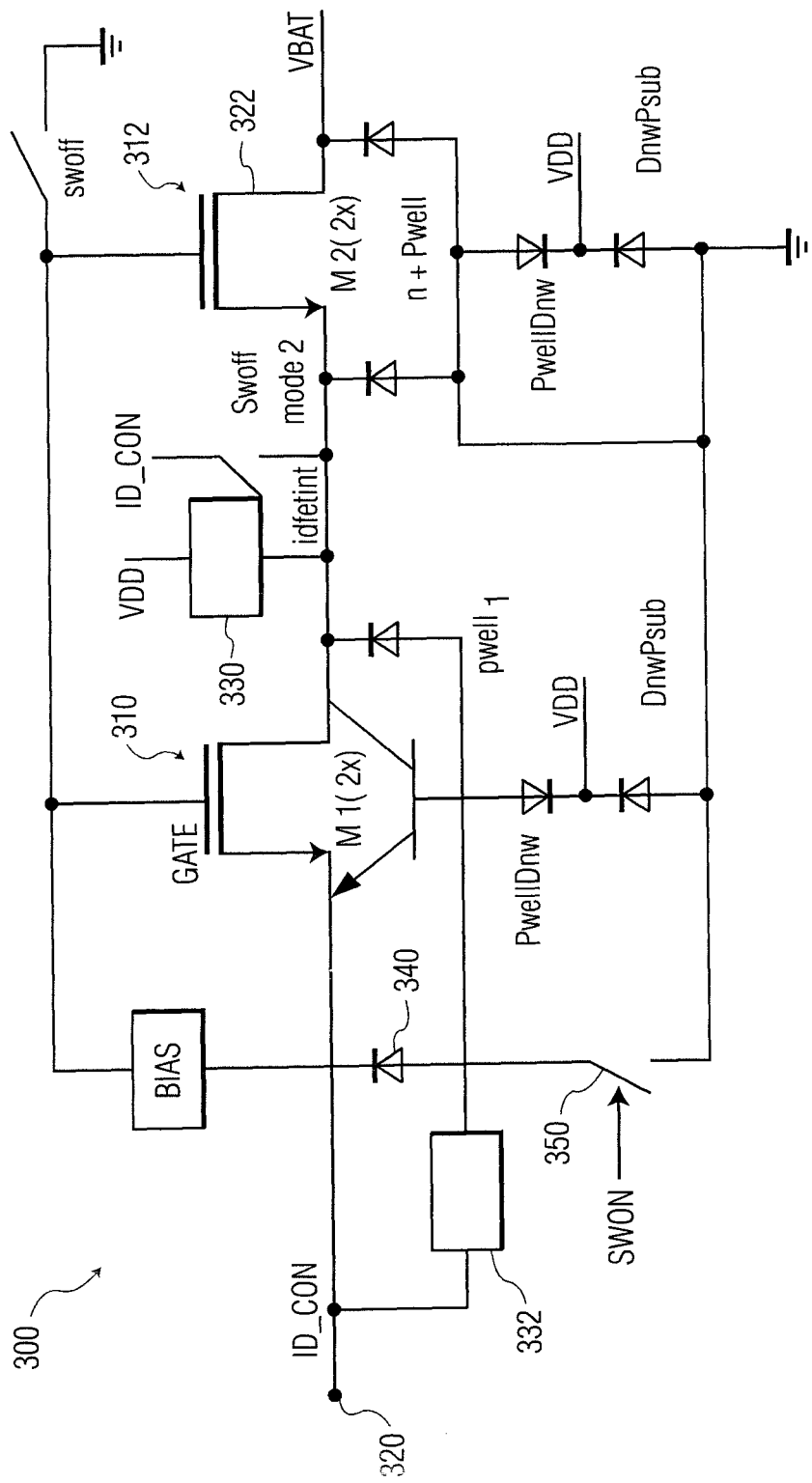
FIG. 3 shows another interface apparatus, in accordance with another example embodiment.

FIG. 3 shows another interface apparatus 300, in accordance with another example embodiment. The apparatus 300 includes respective switches 310 and 312, as transistors coupled in series between an interface port 320 (ID_CON) and an internal battery port 322. A first buffer circuit 330 operates to bias a connection between the switches 310 and 312 to a voltage presented at the interface port 320, and a second buffer circuit 332 operates to similarly bias a diode 340 coupling the interface circuit to a well region to which the switches are coupled as shown. Additional p-n junction regions (and diodes as shown) can be implemented to provide operation of the apparatus. Switch 350 may be opened to float well regions of the respective switches, under operating conditions in which the interface port 320 may be accessed for detecting and identifying an external circuit type connected thereto. The apparatus 300 may, accordingly, be operated and otherwise implemented in a manner similar to that shown with the apparatus 200 in FIG. 2. Current leakage in this regard can be generally limited to leakage across the second switch 312.

Figure 4:
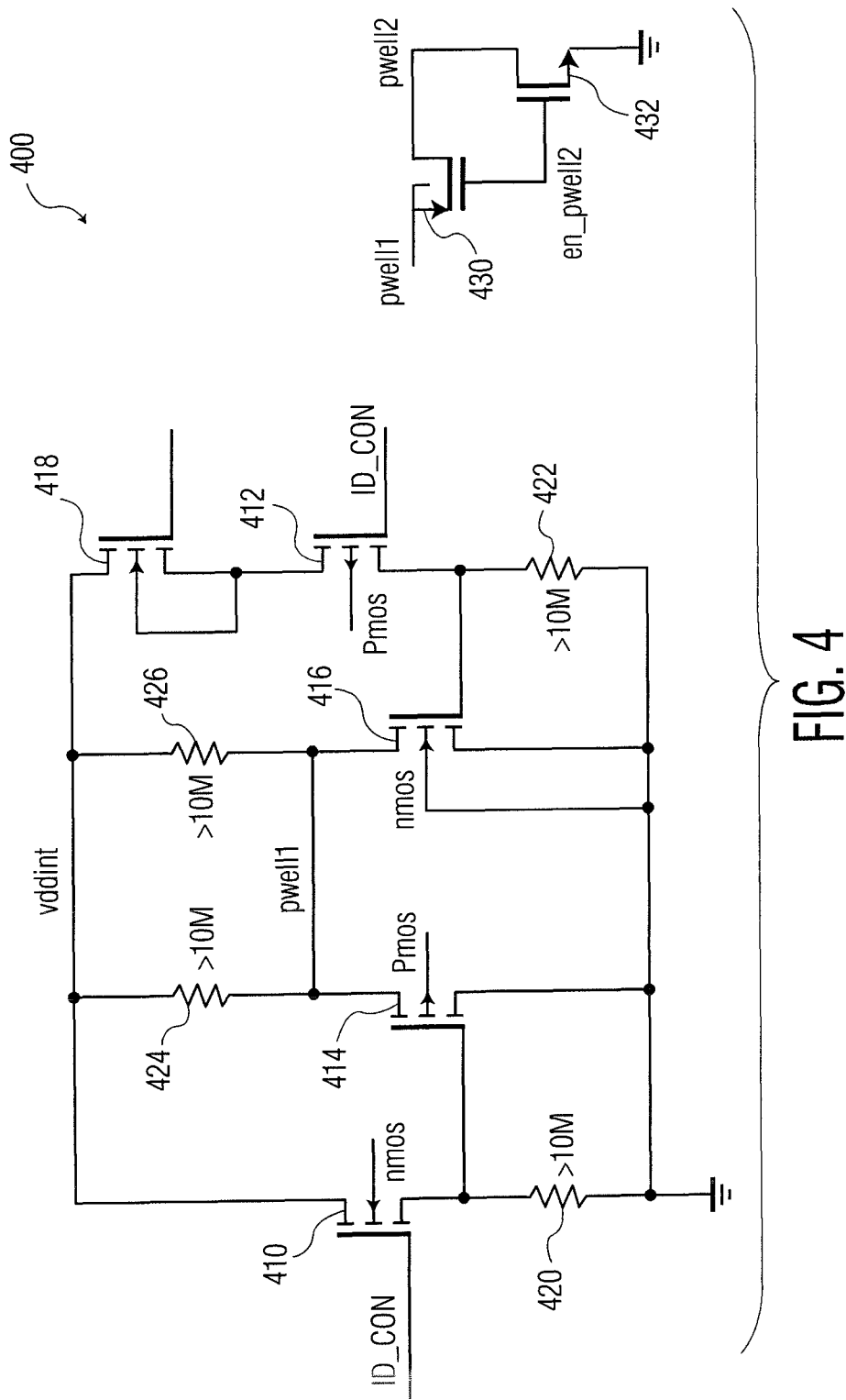
FIG. 4 shows a buffer circuit, as may be implemented in accordance with one or more embodiments.

FIG. 4 shows a buffer circuit 400, as may be implemented in accordance with one or more embodiments. The buffer circuit 400 may, for example, be implemented in connection with the buffer/bias circuit as shown in FIG. 3 and further as shown in FIG. 2, and is described by way of example as implemented in this manner. However, the buffer circuit 400 may be implemented with other circuitry, to suit particular embodiments.

The buffer circuit 400 includes transistors 410 and 412 respectively driven by a voltage on the interface port 320, and transistors 414 and 416 coupled to source/drain regions of transistors 410 and 412 as shown. Each of the transistors is coupled between an internal voltage rail vddint and a reference/ground rail, with transistor 418 and resistors 420, 422, 424 and 426 as shown. Transistor 418 is driven by an internal voltage based on vddint (e.g., at 0.5 vddint).

In various implementations, the respective transistors are implemented with pmos and nmos as shown, and related well regions. The inset shows coupling between well regions via enable switches 430 and 432, such as well regions 214 and 224 as shown in FIG. 2. In a particular embodiment, the pmos transistors turn on a main voltage (e.g. at 0.7 vddint when VBAT=3 V and 0.85 vddint @VBAT=5 V) for coarse detection of a device coupled to the interface port.

Figure 5:
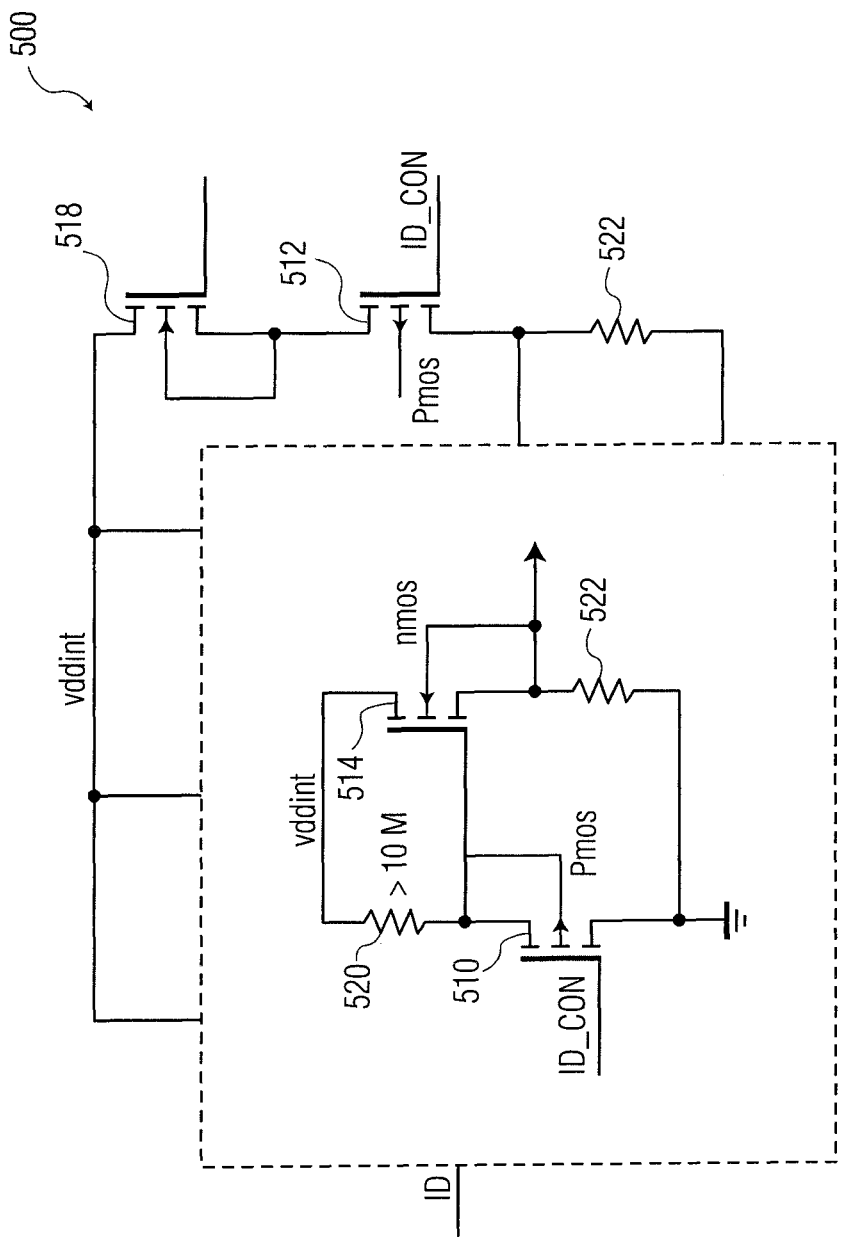
FIG. 5 shows another buffer circuit, as may be implemented in accordance with one or more embodiments.

FIG. 5 shows another buffer circuit 500, as may be implemented in accordance with one or more embodiments. The buffer circuit 500 may, for example, be implemented in connection with the buffer as shown in FIG. 3, and similarly to the buffer circuit 400 shown in FIG. 4 (with similar numbering). The buffer circuit 500 receives a voltage on an interface port (represented by ID_CON by way of example), to drive the gate of transistor 510 shown here being of a pmos type, with transistor 514 being nmos.

The various embodiments described herein may be combined in certain embodiments, and various aspects of individual embodiments may be implemented as separate embodiments. For instance, aspects of FIGS. 1, 3, 4 and 5 can be utilized to perform methods described herein as well as in FIG. 2. For example, apparatus embodiments in accordance with the present disclosure are not limited to the current paths and/or circuit components as characterized herein. Apparatus embodiments can include additional circuit components, such as a load and/or a power source, arranged with the multi junction semiconductor circuit and the various paths described herein, among other arrangements.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., buffering, adaptive biasing, or accessory detection). For example, in certain of the above-discussed embodiments, one or more modules are discrete logic circuits or programmable logic circuits configured and arranged for implementing these operations/ activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/ activities.

Based upon the above discussion and illustrations, those skilled in the art will readily recognize that various modifications and changes may be made to the various embodiments without strictly following the exemplary embodiments and applications illustrated and described herein. For example, various circuitry shown implemented in pmos can be implemented using nmos, as can circuitry using nmos be implemented using pmos. In addition, a variety of approaches may be used to render voltage across a junction or switch to be about equal, to mitigate leakage. In addition, three or more pins may be connected via power switches in a manner as claimed, and additional power switches may be used in which two or more of such switches may be biased to mitigate current leakage as discussed herein. Furthermore, embodiments involving circuit characteristics such as pull-down resistance may be implemented with other characteristics such as pull-up resistance, and those relating to current sources or current sinks. Such modifications do not depart from the true spirit and scope of various aspects of the invention, including aspects set forth in the claims.

What is claimed is:

1. An apparatus comprising:
   an interface port configured and arranged for communicating power and data with external circuits connected to the interface port;
   a first circuit configured and arranged to detect and identify a type of external circuit connected to the interface port, based on electrical characteristics presented at the interface port via the external circuit;
   a first circuit path including first and second transistors that are configured and arranged to couple power between the interface port and an internal circuit, the first transistor having source/drain terminals respectively connected to the interface port and to the second transistor, the second transistor having source/drain terminals respectively connected to the first transistor and the internal circuit; and
   a second circuit configured and arranged with the first circuit and the first transistor to mitigate current leakage by setting a voltage across the source/drain terminals of the first transistor based on a voltage level provided on the interface port.

2. The apparatus of claim 1, wherein
   the first circuit is configured and arranged to detect and identify the type of external circuit connected to the interface port based on electrical characteristics presented at the interface port via the external circuit and selected from the group of: resistance characteristics, current characteristics, voltage characteristics and a combination thereof;

the internal circuit includes a circuit selected from the group consisting of a battery circuit, an internal power circuit, and a combination of the battery circuit and the internal power circuit; and the second circuit is configured and arranged with the first circuit and the first transistor to mitigate the current leakage by mitigating off channel leakage between a source and a drain of the first transistor.

3. The apparatus of claim 1, wherein the second circuit is configured and arranged with the first circuit and the first circuit path to, in response to the external circuit being connected to the interface port, mitigate changes in the electrical characteristics presented at the interface port by the external circuit while the first circuit identifies the type of the external circuit by operating the first and second transistors in an open state, and mitigating current leakage through the first transistor by coupling the voltage at the interface port to the respective source/drain terminals of the first and second transistor that are connected to one another.

4. The apparatus of claim 1, further including a second circuit path having a p-n junction coupled between the interface port and a reference terminal; and a third circuit configured and arranged with the second circuit path to mitigate current leakage through the p-n junction by setting a voltage across the p-n junction to about zero, using the voltage level provided on the interface port.

5. The apparatus of claim 4, wherein the second circuit path includes a switch coupled between the p-n junction and the reference terminal, the second circuit path being configured and arranged to operate in an open condition while the first circuit is detecting and identifying the type of external circuit connected to the interface port.

6. The apparatus of claim 4, wherein the second and third circuits are configured and arranged with the first and second circuit paths to, in response to the external circuit being connected to the interface port, set the voltage across the source/drain terminals of the first transistor to about zero and set the voltage across the p-n junction to about zero; and in response to the first circuit detecting and identifying the type of external circuit connected to the interface port, cease setting the voltages across the source/drain terminals of the first transistor and the p-n junction, couple power between the external circuit and the internal circuit by operating the first and second transistors in a closed state, and connect the p-n junction to the reference terminal.

7. The apparatus of claim 6, wherein the second and third circuits are configured and arranged with the first and second circuit paths to couple power between the external circuit and the internal circuit by powering the external circuit with power from the internal circuit, based on the identified type of external circuit.

8. The apparatus of claim 6, wherein the second and third circuits are configured and arranged with the first and second circuit paths to couple power between the external circuit and the internal circuit by powering the internal circuit with power from the external circuit, based on the identified type of external circuit.

9. The apparatus of claim 1, wherein the first circuit is configured and arranged with the first circuit path and a second circuit path to detect and identify the type of the external circuit based on the electrical characteristics, while the first and second transistors are operated in an open state and while the second circuit sets the voltage across the source/drain terminals of the first transistor, and the first circuit path is configured and arranged with the first circuit and the second circuit path to, in response to the first circuit identifying the type of the external circuit connected to the interface port, cease setting the voltage across the source/drain terminals of the first transistor, and couple power between the external circuit and the internal circuit by connecting the interface port to the internal circuit via the first transistor and the second transistor.

10. The apparatus of claim 9, wherein the apparatus includes a power rail and a reference node configured and arranged to provide power for operating the apparatus, wherein the first and second transistors have source and drain regions in a well region, further including a switch configured and arranged to float the well region, and further including a second circuit path having a p-n junction coupled between the interface port and a reference terminal and configured and arranged to mitigate current leakage through the p-n junction to the reference node by setting a voltage across the p-n junction to about zero, using the voltage level provided on the interface port.

11. The apparatus of claim 1, further including circuitry configured with another circuit path having a p-n junction coupled between the interface port and a reference terminal and configured and arranged to mitigate current leakage through the p-n junction by setting a voltage across the p-n junction.

12. The apparatus of claim 1, wherein the first circuit includes a plurality of variable resistor circuits, and is configured and arranged to detect and identify the type of external circuit connected to the interface port, based on pull down resistance presented at the interface port via the external circuit, by tuning a reference resistance provided by the plurality of variable resistor circuits based on a comparison between the reference resistance and a resistance provided by the external circuit at the interface port.

13. A method comprising:

in a first circuit, detecting and identifying a type of external circuit connected to an interface port, based on electrical characteristics presented at the interface port via the external circuit, the interface port being operable for communicating power and data with external circuits connected thereto;

in a first circuit path including first and second transistors, coupling power between the interface port and an internal circuit via source/drain terminals of the first transistor connected to the interface port and to the second transistor, and via source/drain terminals of the second transistor respectively connected to the first transistor and the internal circuit; and mitigating current leakage by setting a voltage across the source/drain terminals of the first transistor based on a voltage level provided on the interface port.

14. The method of claim 13, wherein detecting and identifying the type of external circuit connected to the interface port includes identifying the type of external circuit based on pull down resistance presented at the interface port by tuning a reference resistance based on a comparison between the reference resistance and a resistance provided by the external circuit at the interface port;

coupling power between the interface port and the internal circuit includes coupling power between the interface port and a circuit selected from the group consisting of a battery circuit, an internal power circuit, and a combination of the battery circuit and the internal power circuit; and mitigating current leakage includes mitigating off channel leakage between a source and a drain of the first transistor.

15. The method of claim 13, wherein mitigating current leakage includes mitigating changes in the electrical characteristics presented at the interface port by the external circuit while identifying the type of the external circuit by
operating the first and second transistors in an open state, and
mitigating current leakage through the first transistor by coupling the voltage at the interface port to the respective source/drain terminals of the first and second transistor that are connected to one another.

16. The method of claim 13, further including, in a third circuit, mitigating current leakage through a p-n junction by setting a voltage across the p-n junction to about zero using the voltage level provided on the interface port, the p-n junction being in a second circuit path between the interface port and a reference terminal.

17. The method of claim 16, further including disconnecting the second circuit path from the reference terminal while detecting and identifying the type of external circuit connected to the interface port.

18. The method of claim 17, further including,
in response to the external circuit being connected to the interface port, setting the voltage across the source/drain terminals of the first transistor to about zero and setting the voltage across the p-n junction to about zero; and
in response to detecting and identifying the type of external circuit connected to the interface port,
ceasing the setting of the voltages across the source/drain terminals of the first transistor and the p-n junction,
coupling power between the external circuit and the internal circuit by operating the first and second transistors in a closed state, and
connecting the p-n junction to the reference terminal.

19. The method of claim 13,
wherein detecting and identifying the type of external circuit includes identifying the external circuit based on electrical characteristics applied to the interface port, while operating the first and second transistors in an open state and while setting the voltage across the source/drain terminals of the first transistor, and
further including, in response to identifying the type of external circuit connected to the interface port, ceasing the setting of the voltage across the source/drain terminals of the first transistor, and coupling power between the external circuit and the internal circuit by connecting the interface port to the internal circuit via the first transistor and the second transistor.

20. An apparatus comprising:
an accessory detection circuit configured and arranged to, in response to an external circuit being connected to an interface port, detect a type of the external circuit based upon a pull-down resistance at the interface port, in which each type of accessory provides a pull-down resistance that is discernable from a pull-down resistance of the other types of accessories;
power switching circuitry including first and second transistors that are configured and arranged to couple power between the interface port and an internal circuit, the first transistor having source/drain terminals respectively connected to the interface port and to the second transistor, the second transistor having source/drain terminals respectively connected to the first transistor and the internal circuit; and
an adaptive biasing circuit configured and arranged with the power switching circuitry to,
while the accessory detection circuit detects the type of the external circuit, mitigate current leakage across the first transistor by
operating the transistors in an open state, and
setting a voltage across the source/drain terminals of the first transistor to about zero, and setting a voltage across a p-n junction coupling the interface port to a reference terminal, based on a voltage level provided on the interface port, thereby mitigating changes in the pull-down resistance due to current leakage, and
in response to detecting and identifying the type of external circuit connected to the interface port, cease setting the voltages across the source/drain terminals of the first transistor and the p-n junction, and couple power between the external circuit and the internal circuit by operating the first and second transistors in a closed state.

* * * * *